United States Patent
Sparka (10) Patent No.: US 9,312,752 B2
(45) Date of Patent: Apr. 12, 2016

(54) ELECTRONICS APPARATUS AND PRODUCTION METHOD FOR AN ELECTRONICS APPARATUS

(75) Inventor: Hartmut Sparka, Schwieberdingen (DE)

(73) Assignee: ROBERT BOSCH GMBH, Stuttgart (DE)

(*) Notice: Subject to any disclaimer, the term of this patent is extended or adjusted under 35 U.S.C. 154(b) by 604 days.

(21) Appl. No.: 13/574,297

(22) PCT Filed: Dec. 30, 2010

(86) PCT No.: PCT/EP2010/070920
§ 371 (c)(1),
(2), (4) Date: Nov. 28, 2012

(87) PCT Pub. No.: WO2011/088961
PCT Pub. Date: Jul. 28, 2011

(65) Prior Publication Data
US 2013/0063907 A1     Mar. 14, 2013

(30) Foreign Application Priority Data
Jan. 22, 2010   (DE) ............... 10 2010 001 152 U (51) Int. Cl.
*H05K 5/02* (2006.01)
*H02M 1/44* (2007.01)
(Continued)

(52) U.S. Cl.
CPC ............ *H02M 1/44* (2013.01); *H05K 1/0233* (2013.01); *H05K 1/0262* (2013.01); *H05K 1/142* (2013.01); *Y10T 29/4913* (2015.01)

(58) Field of Classification Search
CPC ............ H05K 1/02; H05K 5/02; H05K 3/30; H01R 13/66
USPC ............ 361/730, 752; 29/832; 333/182, 183
See application file for complete search history.

(56) References Cited

U.S. PATENT DOCUMENTS 4,401,355 A      8/1983  Young
4,510,445 A  *   4/1985  Kvaternik ............... 324/750.23
(Continued)

FOREIGN PATENT DOCUMENTS

CN      1985428     6/2007
EP    1 505 857     2/2005

OTHER PUBLICATIONS

K.H Torvmark, LC Filter with improved high-frequency attenuation, 2003, Chipcon AS http://www.ti.com/lit/an/swra064/swra064.pdf.*
(Continued)

*Primary Examiner* — Jayprakash N Gandhi
*Assistant Examiner* — Mandeep S Buttar
(74) *Attorney, Agent, or Firm* — Kenyon & Kenyon LLP (57) ABSTRACT

An electronics apparatus having a housing, an inverting device, a first circuit board connected to the inverting device via at least one line, and a second circuit board connected via a first galvanic connection to the first circuit board and connected via a second galvanic connection to at least component, and having a first filter situated on the first circuit board and upstream from the first galvanic connection, the first filter having a first discharge connection to the housing, and having a second filter situated on the second circuit board and downstream from the first galvanic connection, the second filter having a second discharge connection to the housing, and having a third filter situated on the second circuit board and upstream from the second galvanic connection, the third filter having a third discharge connection to the housing. A method for producing an electronics apparatus is also described.

10 Claims, 3 Drawing Sheets

(51) Int. Cl.
*H05K 1/02* (2006.01)
*H05K 1/14* (2006.01)

(56) References Cited

U.S. PATENT DOCUMENTS

| | | | | |
|---|---|---|---|---|
| 4,516,815 | A | * | 5/1985 | Venable et al. ............. 439/95 |
| 5,091,823 | A | | 2/1992 | Kanbara et al. |
| 5,220,298 | A | * | 6/1993 | Nagase ............. H01L 23/552 257/E23.114 |
| 5,761,051 | A | | 6/1998 | Tran |
| 2003/0200761 | A1 | | 10/2003 | Funahashi et al. |
| 2006/0114704 | A1 | | 6/2006 | Chen |
| 2007/0296271 | A1 | | 12/2007 | Torigoe et al. |
| 2010/0060537 | A1 | * | 3/2010 | Nagayama ................. 343/776 |

OTHER PUBLICATIONS

International Search Report, PCT International Application No. PCT/EP2010/070920, dated Apr. 12, 2011.

\* cited by examiner

ELECTRONICS APPARATUS AND PRODUCTION METHOD FOR AN ELECTRONICS APPARATUS

FIELD OF THE INVENTION

The present invention relates to an electronics apparatus. In addition, the present invention relates to a method for producing an electronics apparatus.

BACKGROUND INFORMATION

Figure 1:
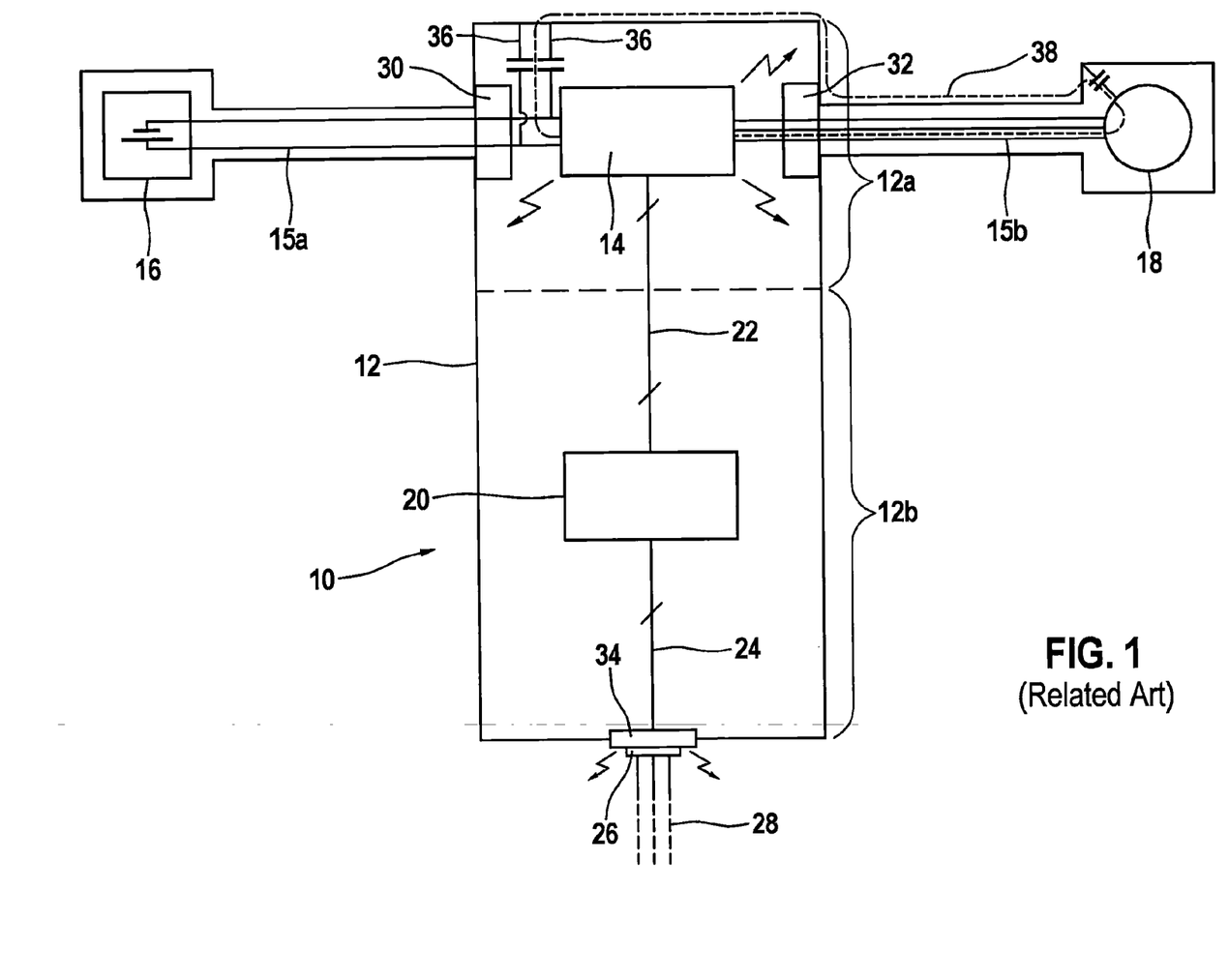
FIG. 1 shows a schematic representation of a conventional electronics apparatus.

FIG. 1 shows a schematic representation of a conventional electronics apparatus. An example of such an electronics apparatus is for example the energy converter described in U.S. Published Patent Application No. 2007/0296271 A1.

The schematically shown electronics apparatus 10 has an (expanded) housing 12 that is capable of being divided (schematically) at least into a high-voltage area 12a and a low-voltage area 12b. In high-voltage area 12a there is situated at least one inverting device 14 that is electrically connected at the input side to a battery 60 via a first electrical connection 15a, and is electrically connected at the output side to a motor 18 via a second electrical connection 15b. Low-voltage area 12b has at least one component 20 for operating electronics device 10. The schematically shown at least one component 20 of low-voltage area 12b is electrically connected to inverting device 14 via a first internal line 22. A second internal line 24 connects the at least one component 20 of low-voltage area 12b to a plug connector 26 attached to housing 12, to which an external line 28 can be coupled for a conductive connection between electronics apparatus 10 and a further device (not shown).

In order to filter out electromagnetic interferences that may occur in high-voltage area 12a, in particular due to parasitic capacitances of the machine winding, electronics apparatus 10 can additionally be equipped with filter blocks 30 through 34. The depicted electronics apparatus 10 has a first filter block 30 that is situated within first electrical connection 15a between battery 60 and inverting device 14. A second filter block 32 is situated in second electrical connection 15b from inverting device 14 to engine 18. A third filter block 34 of low-voltage area 12b is situated between second line 24 and plug connector 26. Standardly, each of the filter blocks 30 through 34 is fashioned as a specific filter assembly. Such a filter block 30 through 34 can be realized as a unit made up of a plurality of capacitors and inductors, and at least one Y capacitor 36 can provide a low-impedance path 38 as a feedback path for electromagnetic interference.

SUMMARY

In accordance with the present invention, an example interference suppression design of an electronics apparatus is provided using a plurality of filters situated on at least two circuit boards, whose configuration can also be designated an "in-series connection" of the filters situated on the circuit boards. Using the interference suppression design, high-frequency, high-energy interferences can easily be filtered out. In contrast to the conventional use of expensive filters in the low-voltage area/high-voltage area, which as a rule are very expensive and require a large amount of installation space, the interference suppression design according to the present invention can be realized using filters that are inexpensive and that require little installation space. The example electronics apparatus according to the present invention and the corresponding production method thus may offer in particular a reduction of the installation space of the electronics apparatus, with low manufacturing costs and/or better interference suppression.

The present invention may be advantageous for an electronics apparatus having a high-voltage area in which high-energy high-frequency interferences can occur that conventionally can couple inside the housing and can produce electromagnetic cavity modes in connection above all with the connected cooperating devices, e.g., an engine, an electric machine, a battery, and/or a generator. In contrast, the high-frequency interferences produced in the inverting device (inverter, double inverter) of the electronics apparatus according to the present invention are transferred to other assemblies/circuit boards/hybrids inside the electronics apparatus, and interference in sensitive components/assemblies is suppressed using low-cost filters. Thus, the present invention may offer a low-cost filtering, requiring little installation space, of the connecting lines between the circuit boards and the housing potential, and thus offers a walling off of the connecting paths/coupling paths that lead from the device, in particular from the sealed and shielded high-voltage area, to the surrounding environment.

Compared to a shielding of a circuit board by a lead lining, which, due to a through-hole required for the electrical contacting of the circuit board, does not enable shielding of the circuit board against electromagnetic interferences, the "in-series connection" of the low-cost filters can also protect an electric component situated on a circuit board against electromagnetic interferences. This is ensured in particular if multi-stage filters that are low in cost and that require little installation space, each having a interference discharge line to the housing potential, are used on the connecting plugs on the circuit boards.

The "in-series connection" of at least three filters according to the example interference suppression design described may ensure in particular a reliable filtering out of high-frequency signals, which is the form in which the electromagnetic interferences usually occur. In contrast, useful signals, which are usually transmitted at a lower frequency, are not attenuated by the interference suppression design.

An "in-series connection" of three filters according to the interference suppression design described here may ensure a reliable filtering out of electromagnetic interferences. Thus, the second circuit board can for example be electrically connected, via the second galvanic connection, to an external contact situated in the housing, the "in-series connection" of the three filters ensuring that electromagnetic interference signals are not forwarded to an external device via an electrical connection coupled to the external contact.

In an advantageous development, the second circuit board is electrically connected, via the second galvanic connection, to a third circuit board as the at least one component situated in the housing. In addition, the third circuit board can be electrically connected, via a third galvanic connection, to at least one further component of the electronics apparatus, situated in the housing and/or on the housing. Preferably, in this case the electronics apparatus includes a fourth filter having a fourth discharge connection to the housing, situated on the third circuit board and downstream from the second galvanic connection, and a fifth filter having a fifth discharge connection to the housing, situated on the third circuit board and upstream from the third galvanic connection. This "in-series connection" ensures a reliable filtering out of electromagnetic interferences even given the use of five preferably low-cost filters. In this way, it is ensured that the additional component of the electronics apparatus, connected to the third circuit board via the third galvanic connection, is reliably shielded against electromagnetic interferences. In particular, the third circuit board can be electrically connected via the third galvanic connection to an external contact situated in the housing as further component of the electronics apparatus. In this case, it may be ensured that an external device coupled electrically to the external contact is reliably protected from the electromagnetic interferences.

It is to be noted that the electronics apparatus is not limited to a number of three circuit boards and/or five filters. The additional equipping of the electronics apparatus with the fourth and the fifth filter is optional. Likewise, the electronics apparatus may have more than three circuit boards and/or five filters.

The first filter, the second filter, the third filter, the fourth filter, and/or the fifth filter can be fashioned as T filters. In this way, low-cost filters that require little installation space can be used for the electronics apparatus.

Simultaneously, the advantageous interference suppression may be ensured even with the use of such low-cost and small T filters.

The first galvanic connection, the second galvanic connection, and/or the third galvanic connection can each have at least one wire and/or one cable.

Preferably, the first galvanic connection has a first ribbon cable, the second galvanic connection has a second ribbon cable, and/or the third galvanic connection has a third ribbon cable. Such a realization of the first galvanic connection, the second galvanic connection, and/or the third galvanic connection brings about an inductance of the respective galvanic connection for high-frequency interferences. In contrast, useful signals are unproblematically transmitted via a ribbon cable. Thus, at least one galvanic connection having a ribbon cable brings about a reliable filtering out of interferences with simultaneous undisturbed transmission of useful signals. Instead of a ribbon cable, at least one of the above-named galvanic connections can also have a different type of cable and/or a wire.

For example, the first ribbon cable, the second ribbon cable, and/or the third ribbon cable can have a length in a range of from 5 cm to 50 cm, and/or a width in a range of from 3 cm to 10 cm. Advantageously, the at least one ribbon cable has a length of from 10 cm to 30 cm, preferably of from 15 cm to 25 cm. The width of the at least one ribbon cable can in particular be in a range of from 5 cm to 10 cm. Given such a realization of the at least one ribbon cable, a reliable filtering out of the high-frequency interference signals is reliably ensured at low cost, with simultaneous undisturbed transmission of the desired useful signals.

In particular, the first filter, the first galvanic connection, and the second filter can work together as a first pi filter (πfilter), and/or the third filter, the second galvanic connection, and the fourth filter can work together as a second pi filter (πfilter). Preferably, the filters and the galvanic connections are fashioned in such a way that one can speak of an "in-series connection" of pi filters. Such a filter design can be realized at low cost and requires little installation space. In comparison with a conventional filter, such a filter design having at least one pi filter fashioned in this way has an advantageous filter characteristic, is producible at low cost, and requires little installation space.

In a development, the electronics apparatus can include at least one plate-type shielding unit that is fashioned at least partly of a conductive material and that is electrically connected to the allocated discharge connection of the first, second, third, fourth, and/or fifth filter and to the housing. Such a shielding unit, for example a shielding plate and/or a housing formed part, improves the filtering out of the undesired interference signals, and reduces mode interference. In addition, such a shielding unit is producible at low cost. The shielding unit requires very little additional installation space on the electronics apparatus. In particular, the electronics apparatus can have a plurality of such shielding units, configured in an electrical contact to the discharge connections of various filters. In addition, the described filters and the at least one plate-type shielding unit also bring about an attenuation of electromagnetic modes that could otherwise travel into the surrounding environment in an uncontrolled manner via a low-voltage connection.

For example, on the first circuit board there can be fashioned an inverter controlling, on the second circuit board there can be fashioned a control electronics system, and/or on the third circuit board there can be fashioned a plug electronics system. Such circuit boards can advantageously be used for a broad spectrum of electronics apparatuses, for example in a power electronics system, in a pulse inverter, or in a converter.

The electronics apparatus can be fashioned as a power electronics system, as a pulse inverter, as a hybrid engine, and/or as a DC/DC converter. Such a design of the electronics apparatus can be used above all in a vehicle in order to ensure a high standard of safety, due to the advantageous filter design of the electronics apparatus.

The advantages described above can also be realized using a corresponding production method.

BRIEF DESCRIPTION OF THE DRAWINGS

Further features and advantages of the present invention are explained below on the basis of the figures.

DETAILED DESCRIPTION OF EXAMPLE EMBODIMENTS

Figure 2:
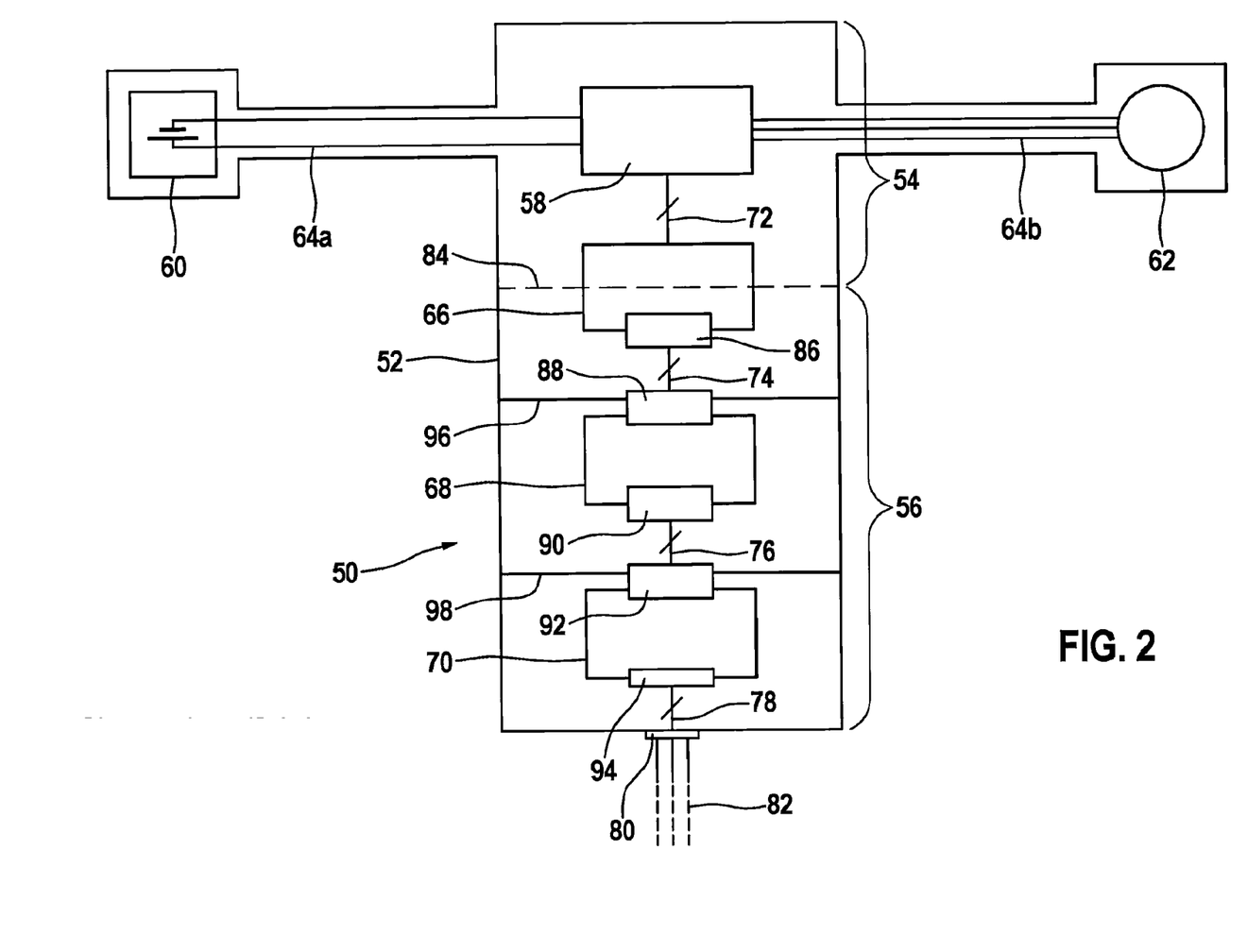
FIG. 2 shows a schematic representation of a specific embodiment of the electronics apparatus.

FIG. 2 shows a schematic representation of a specific embodiment of the electronics apparatus.

Electronics apparatus 50 shown schematically in FIG. 2 has an (expanded) housing 52 that is fashioned at least partly from a conductive material. The conductive material of housing 52 can be a metal and/or a doped semiconductor material. Preferably, housing 52 is made completely of the conductive material.

In the depicted specific embodiment, the interior space of housing 52 can be divided (schematically) at least into an interference area, fashioned as high-voltage area 54, and at least one area that is fashioned as low-voltage area 56 and is decoupled by the filtering described below. However, electronics apparatus 50 is not limited to such a division into at least one interference area and at least one decoupled area, or to the realization of these as high-voltage area 54 and low-voltage area 56. Instead, the depicted division is intended to demonstrate merely as an example that the technology according to the present invention described below is also applicable to an electronics apparatus 50 in which, during operation of electronics apparatus 50, a high voltage is applied to at least one component, while for at least one other component of electronics apparatus 50 the application of a significantly reduced voltage is preferred.

Depicted electronics apparatus 50 has an inverting device 58 that is preferably situated in high-voltage area 54. Inverting device 58, which for example can also be referred to as an inverter and/or as a converter (e.g., a DC/DC converter), can include at least one bipolar transistor having an insulated gate electrode (IGBT, Insulated Gate Bipolar Transistor). Optionally, a battery 60 and/or a motor 62 (electric motor) can also be situated inside housing 52. Because electronics apparatus 50, as described in more detail below, can be fashioned with a significantly reduced extension/significantly reduced installation space requirement, the additional situation of battery 60 and/or of motor 62 inside housing 52, preferably in high-voltage area 54, is easily realizable. In this case, it is possible to connect inverting device 58 to battery 60 and/or to motor 62 via a respective electrical connection that is easy and economical to realize. For example, a first high-voltage line 64a can run inside housing 52 from battery 60 to inverting device 58. Correspondingly, a second high-voltage line 64b, also situated in the housing, can electrically connect inverting device 58 to motor 62. In this case, housing 52 additionally ensures a shielding of high-voltage lines 64a and 64b.

In addition to inverting device 58, electronics apparatus 50 includes at least two circuit boards 66 through 70 situated inside housing 52. In the depicted specific embodiment, electronics apparatus 50 has three circuit boards 66 through 70. However, the realizability of electronics device 50 described here is not limited to a particular number of circuit boards 66 through 70. A circuit board 66 through 70 is here to be understood also as a PCB unit (Printed Circuit Board), a circuit card, a printed circuit, a hybrid, and/or a corresponding unit as bearer for at least one electrical component. The term used hereinafter, "circuit board 66 through 70," includes all the specific embodiments here enumerated. Generally, such a circuit board 66 through 70 is made up of an electrically insulating material having conductive connections adhering thereto (conductor paths). Preferably, circuit board 66 through 70 realizes a multiple functionality for the mechanical fastening and/or electrical connection of the component fashioned thereon. Electronics apparatus 50 described here is not limited to a particular realization of a usable circuit board 66 through 70, for example a particular insulating material or a particular circuit pattern of the conductor paths, or to the electrical component fashioned thereon. Because almost every electrical device will therefore include at least two such circuit boards 66 through 70, the technology described hereinafter is applicable to a large number of electrical devices.

A first circuit board 66 is electrically connected to inverting device 58 via at least one line 72. A second circuit board 68, electrically connected to first circuit board 66 via a first galvanic connection 74, is electrically connected to third circuit board 70 via a second galvanic connection 76. Third circuit board 70 is electrically connected to an external contact 80, situated on housing 52, of electronics apparatus 50, for example with a plug connector, via a third galvanic connection 78. An external line 82 can for example be capable of being coupled to external contact 80, by which line electronics apparatus 50 can be electrically connected to a further device (not shown). However, it is to be noted that electronics apparatus 50 is not limited to a third galvanic connection 78 that electrically connects third circuit board 70 to an external contact 80. Instead of external contact 80, third circuit board 70 can for example also be electrically connected, via third galvanic connection 78, to another component, situated in housing 52 and/or on housing 52, of electronics apparatus 50.

First circuit board 66 can for example be situated in housing 52 in such a way that a border area 84 between high-voltage area 54 and low-voltage area 56 divides first circuit board 66. Second circuit board 68 and third circuit board 70 can in this case be situated inside low-voltage area 56. However, it is to be noted that electronics apparatus 50 is not limited to such a positioning of circuit boards 66 through 70.

First circuit board 66 can be coupled mediately or immediately to inverting device 58 via line 72. For example, first circuit board 66 can be electrically connected via line 72 to a further component of electronics apparatus 50, which can for its part be electrically coupled mediately or immediately to inverting device 58 via a further line. However, FIG. 2 does not show such an embodiment of electronics apparatus 50.

Line 72, via which first circuit board 66 is electrically connected to inverting device 58, can for example be a cable, in particular a ribbon cable. However, such a design of line 72 is not required for the realization of electronics apparatus 50.

The form of electronics apparatus 50 is not limited to the represented number of galvanic connections 74 through 78. Instead, the number of galvanic connections 74 through 78 of electronics apparatus 50 can be equal to two, or at least equal to four. At least one of galvanic connections 74 through 78 can be an electrical connection. Preferably, at least one of galvanic connections 74 through 78 is a ribbon cable or is fashioned as a ribbon cable. In an advantageous specific embodiment of electronics apparatus 50, first galvanic connection 74 has a first ribbon cable, second galvanic connection 76 has a second ribbon cable, and third galvanic connection 78 has a third ribbon cable. A length of the at least one ribbon cable can be in a range of from 5 through 50 cm, preferably from 10 through 30, in particular from 15 through 25. A width of the at least one ribbon cable can be in a range of from 3 through 12 cm, preferably 5 through 10 cm. Such low-cost ribbon cables can include a plurality of individual conductors, for example 42 individual conductors (42 supply lines). The advantages of equipping electronics apparatus 50 with at least one galvanic connection 74 through 78 fashioned as a ribbon cable are discussed in more detail below. It is to be noted that despite the use of the schematic symbol for a plurality of conductors, line 72 and galvanic connections 74 through 78 are however not limited to being equipped with a cable that includes a plurality of conductors.

Electronics apparatus 50 has a first filter 86 having a first discharge connection to housing 52. First filter 86 is situated on first circuit board 66. Moreover, first filter 86 is connected upstream from first galvanic connection 74. Here, a connection of first filter 86 upstream from first galvanic connection 74 is preferably to be understood as meaning that first filter 86 is electrically coupled at the input side to at least one component situated on first circuit board 66, and at the output side is electrically connected to first galvanic connection 74. A flow of current between the at least one component situated on first circuit board 66 and first galvanic connection 74 thus takes place via first filter 86.

On second circuit board 68 there is situated a second filter 88 having a second discharge line to housing 52. Second filter 88 is situated downstream from first galvanic connection 74. A connection of second filter 88 downstream from first galvanic connection 74 can preferably be understood as meaning that second filter 88 is electrically connected to first galvanic connection 74 at the input side and at the output side is electrically coupled to at least one component situated on second circuit board 68. Preferably, a flow of current between first galvanic connection 74 and the at least one component situated on second circuit board 68 takes place via second filter 88.

On second circuit board 68 there is also situated a third filter 90 having a third discharge connection to housing 52. Third filter 90 is connected upstream from second galvanic connection 76. In order to explain the connection of third filter 90 upstream from second galvanic connection 76, reference is made to the above description of the connection of first filter 86 upstream from first galvanic connection 74.

Preferably, on third circuit board 70 there is situated a fourth filter 92 having a fourth discharge connection to housing 52 and/or a fifth filter 94 having a fifth discharge connection to housing 52. In a preferred specific embodiment of electronics device 50, fourth filter 92 is connected downstream from second galvanic connection 76 and/or fifth filter 94 is connected upstream from third galvanic connection 78. For the explanation of the terms "upstream" and "downstream," see above.

At least one of the at least three filters 86 through 94 can be situated on a connecting plug of upstream or downstream galvanic connection 74 through 78 on allocated circuit board 66 through 70. Such a situation of at least one filter 86 through 94 can be realized at low expense and ensures a reliable filtering out of interference signals. This configuration of filters 86 through 94 can also be described as situation on the plug connectors of circuit boards 66 through 70.

First filter 86, second filter 88, third filter 90, fourth filter 92, and/or fifth filter 94 can be fashioned as T filters. A T filter is to be understood as a filter whose circuit topology looks like the letter T. As a rule, in the signal line of such a T filter there is situated (looped in) at least one component such as a resistor, a capacitor, an inductor, and/or a more complex circuit, a tap (discharge connection) leading from a node point situated in the signal line to housing 52, in which tap there is situated a capacitor or a corresponding component (a more complex circuit). A T-filter that is usable for filters 86 through 94 can for example be fashioned as a T-low-pass element having two resistors in the signal line and having a capacitor in the discharge connection to housing 52, as a T-low-pass element having two inductors in the signal line and having a capacitor in the discharge connection to housing 52, and/or as a T-high-pass element having two capacitors in the signal line and having a resistor in the discharge connection to housing 52. However, the construction of filters 86 through 94 is not limited to a T filter, in particular a T-low-pass element or a T-high-pass element.

The at least three filters 86 through 94 can also be designated SMD (Service Mounted Device) components, due to the capacitor present in each case in the discharge connection to housing 52. A low-cost and easy-to-install capacitor may be used for the SMD component that can be used for the at least three filters 86 through 94, the circuit board of said capacitor having a ground connection to housing 52. The discharge connection of a filter 86 through 94 is therefore easily achieved via a capacitor. In particular, filters 86 through 94 can reliably execute their function, described in more detail below, even if they have a comparatively small extension and/or light weight. Thus, the equipping of electronics apparatus 50 with the at least three filters 86 through 94 is not accompanied by a significant increase in weight of electronics apparatus 50 and/or a larger installation space requirement of electronics apparatus 50.

The at least one T filter can, at a first end of the signal line, contact a component situated on allocated circuit board 66 through 70. A second end of the signal line can open into the upstream or downstream galvanic connection 74 through 78. Such a configuration of the at least one T filter ensures a particularly good filtering out of interference signals.

In a development of depicted electronics apparatus 50, it is also possible for at least one fourth circuit board to be equipped with preferably three such filters. For example, a sixth filter can be connected downstream from third galvanic connection 78, while a seventh filter is connected upstream from a further galvanic connection. Corresponding to the above-described filters 86 through 94, the sixth and seventh filter can each have a discharge connection to housing 52. Because the low-cost, light, and/or space-saving specific embodiments already enumerated above are usable for the sixth filter and/or for the seventh filter, an additional development of electronics apparatus 50 with at least two additional filters is not associated with significantly increased production costs, a significant increase in weight, and/or a larger installation space requirement. The filter design depicted on the basis of FIG. 2 and explained in more detail below using filters 86 through 94 is thus expandable to a larger number of filters. The advantages of electronics apparatus 50 described here result due to the fact that, due to the "in-series connection" at least of first filter 86, second filter 88, and third filter 90 in the manner described above, it is possible to filter out high-frequency interferences in a targeted manner, i.e., to discharge them via housing 52. This filtering using at least the three filters 86 through 90 does not adversely affect, or does so only to a small extent, the forwarding of useful signals via galvanic connections 74 through 78. Thus, the depicted filter configuration having at least filters 86 through 90 offers a reliable, low-cost, low-weight, space-saving filtering that is directed in a targeted manner to high-frequency interference signals. In this way, an interference suppression design of electronics apparatus 50 including a multistage broadband frequency filter design is realizable in such a way that electromagnetic interferences, such as those that may arise for example due to parasitic capacitances in the machine winding, can be discharged via housing 52. Exiting or straying of such electromagnetic interferences to the surrounding environment is thus reliably prevented.

The interference suppression design realized using at least filters 86 through 90 offers an advantageous alternative to the conventional equipping of electronics apparatus 50 with filter blocks. Because such filter assemblies require a comparatively large amount of space and have high production costs, using at least filters 86 through 90 the costs and/or installation space requirement for electronics apparatus 50 can be reduced. In addition, the interference suppression outlay/development expense of the higher-order filter blocks used in a conventional manner is very high and can only be realized using simulation tools and a large amount of measurement technology. This disadvantage is also circumvented by the interference suppression design according to the present invention.

Because in particular it is no longer necessary to situate filter blocks in the area of the electrical connections between battery 60 and inverting device 58 and between inverting device 58 and engine 62, electronics apparatus 50 can easily be fashioned as an assembly having a closed (expanded) housing 52 including shielded/closed high-voltage area 54 with high-voltage lines shielded at the periphery, and having a low-voltage area 56. The interference suppression design using at least filters 86 through 90 thus also enlarges the degrees of freedom in the realization of electronics apparatus 50. In addition, in contrast to the conventional filter blocks, which do not ensure shielding inside housing 52, an additional shielding effect of individual components of electronics apparatus 50 can be realized.

First galvanic connection 74 and/or second galvanic connection 76 here act as an inductor for the undesired high-frequency interference signals. This ensures a targeted filtering out of the high-frequency interference signals, while at the same time the useful signals that are to be forwarded via galvanic connections 74 through 78 are not adversely affected, or are only slightly adversely affected. The "in-series connection" of the depicted filters 86 through 94 can also be described as the working together of first filter 86, first galvanic connection 74, and second filter 88 as a first pi filter (π filter) and/or the working together of third filter 90, second galvanic connection 76, and fourth filter 92 as a second pi filter (πfilter).

The advantageous multifunctionality of at least one of galvanic connections 74 through 78 is in particular ensured as long as the respective galvanic connection 74 through 78 includes a ribbon cable. Here, a length of the ribbon cable of from 5 through 50 cm, preferably 10 through 30 cm, preferably 15 through 25 cm is particularly advantageous. Correspondingly, the use of at least one ribbon cable having a width of from 3 through 12 cm, advantageously 5 through 10 cm, can also ensure the desired multifunctionality of the respective galvanic connection 74 through 78. In a preferred specific embodiment of electronics apparatus 50, galvanic connections 74 through 78 include ribbon cables having a length of 20 cm and a width of 7 cm. This ensures the above-described targeted filtering out of high-frequency interferences over a frequency range that reliably covers the usually occurring high-frequency interferences.

Supplementing the at least three filters 86 through 90, electronics apparatus 50 can also include at least one plate-type shielding unit 96 or 98 that is made at least partly of a conductive material such as metal and/or a doped semiconductor material. The at least one plate-type shielding unit 96 and/or 98 is in this case connected electrically to an associated discharge connection of the respective filter 86 through 94 adjacent which it is situated, and to housing 52. A suitable plate-type shielding unit 96 and 98 can for example be a shielding plate and/or a formed part of the housing.

Depicted electronics apparatus 50 includes for example a first plate-type shielding unit 96 that is electrically connected to the discharge connection of second filter 88 and a second plate-type shielding unit 98 that is electrically connected to the discharge connection of fourth filter 92.

It is to be noted that electronics apparatus 50 described here is not limited to being equipped with a particular number of shielding units 96 and 98 and/or to an electric coupling of the at least one shielding unit 96 or 98 to a discharge connection of a particular filter 86 through 94. Thus, in the production of electronics apparatus 50 an advantageous freedom of variation is ensured with regard to the attachment of the at least one shielding unit 96 and/or 98. The depicted filter design is thus capable of being combined with a shielding having at least one plate-type shielding unit 96 and/or 98. For example, in addition to the interference suppression design using filters 86 through 94, a shielding via shielding units 96 and 98 fashioned as shielding plates can also be realized in such a way that individual circuit boards 66 through 70 are shielded from one another. An advantageous quality of this filtering can be increased by a multi-stage construction.

In an advantageous specific embodiment of electronics apparatus 50, an inverter controlling can be fashioned on first circuit board 66, a control electronics can be fashioned on second circuit board 68, and/or a plug electronics can be fashioned on third circuit board 70. The inverter controlling, which can also be designated a gate driver, is preferably half situated in high-voltage area 54 and half in low-voltage area 56. In this way, using filters 86 through 94 a multistage filter configuration is fashioned having a first filter stage at the output of the gate driver, a second filter stage at the input of the control electronics, having a third filter stage at the output of the control electronics, having a fourth filter stage at the input of the plug electronics, and having a fifth filter stage at the output of the plug electronics. Electronics apparatus 50 described here is however not limited to such a construction.

A further advantage of filters 86 through 90, or through 94, is that the filtering can be carried out not in high-voltage area 54 but rather in low-voltage area 56, so that electronics apparatus 50 can be produced at lower cost and has a better performance spectrum (e.g., an improved temperature resistance). For example, using filters 86 through 90 or 94 described here, the use of Y capacitors, which as a rule do not ensure reliable functioning outside a comparatively narrow temperature range, can be done without. Thus, electronics apparatus 50 described here, producible at low cost, can be reliably operated even at extreme temperatures.

Electronics apparatus 50 described in the foregoing can be fashioned as a power electronics system. In particular, electronics apparatus 50 can be fashioned as a pulse inverter, a hybrid engine, or as a DC/DC converter. However, it is to be noted that the applicability of the filter design described in the foregoing having at least filters 86 through 90 is not limited to an electronics apparatus 50 fashioned in this way.

In addition to the filters 86 through 90 and plate-type shielding units 96 and 98, shown schematically in FIG. 2, electronics apparatus 50 can include further filter components such as for example at least one of the filter components depicted in FIG. 1, and/or at least one Y capacitor. However, further depiction of such a filter component is not provided in FIG. 2, in order to illustrate that the interference suppression design of filters 86 through 90 is sufficient for reliable protection from interference signals.

Figure 3:
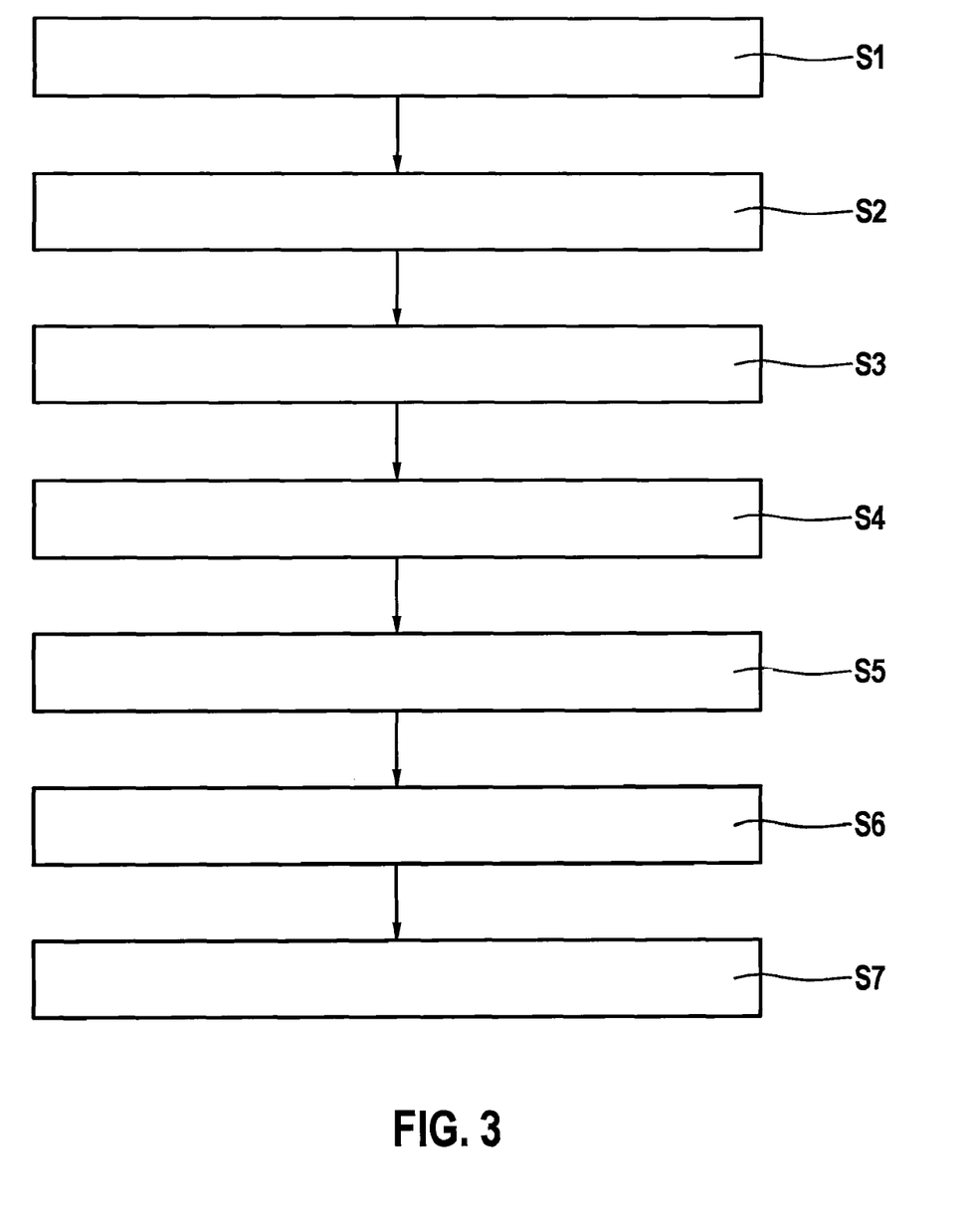
FIG. 3 shows a flow diagram representing a specific embodiment of the method of producing an electronics apparatus.

FIG. 3 shows a flow diagram representing a specific embodiment of an example method for producing an example electronics apparatus.

In a method step S1 of the example production method, an inverting device, a first circuit board, and a second circuit board are situated in a housing that is fashioned at least partly of a conductive material. However, it is to be noted that the electronics apparatus that is to be produced is not limited to a number of exactly 2 circuit boards. Thus, it is also possible to situate more than two circuit boards in the housing together with the inverting device. Optionally, it is also possible to situate at least one further component of the electronics device in the housing and/or on the housing.

In a method step S2, the inverting device is electrically connected to the first circuit board via at least one line. In particular, the inverting device can be connected to the first circuit board via a high-voltage line.

In a method step S3, a first galvanic connection between the first circuit board and the second circuit board is fashioned in such a way that the first circuit board is electrically connected to the second circuit board via the first galvanic connection. Correspondingly, in a method step S4 the second circuit board is electrically connected via a second galvanic connection to at least one component, situated in the housing and/or on the housing, of electronics apparatus 50. Preferably, in at least one of the method steps S3 or S4 a ribbon cable having a length of from 5 through 50 cm, preferably 10 through 30 cm, in particular 15 through 25 cm, and having a width of from 3 through 12 cm, preferably 5 through 10 cm, is positioned between the first circuit board and the second circuit board and/or between the second circuit board and the at least one component. Correspondingly, in at least one further method step at least one further ribbon cable can be positioned between two further circuit boards of electronics apparatus 50.

In addition, in a method step S5 a first filter situated on the first circuit board is fashioned having a first discharge connection to the housing, the first filter being connected upstream from the first galvanic connection. Correspondingly, in a method step S6 a second filter having a second discharge connection is situated on the second circuit board. Here, the second filter is fashioned such that the second filter is situated downstream from the first galvanic connection. In addition, in a method step S7 a third filter is fashioned in such a way that it is situated on the second circuit board with a third discharge connection to the housing, and is situated upstream from the second galvanic connection. The carrying out of method steps S5 through S7 ensures the above-described advantages.

However, the production method described here is not limited to an equipping of the electronics apparatus with only three such filters. As an addition to the production method indicated here, further filters may correspondingly be fashioned on at least one additional circuit board.

In a development of the described production method, at least one plate-type shielding unit can be situated in the housing of the electronics apparatus, the shielding unit, fashioned at least partly from a conductive material, being electrically connected to an allocated discharge connection of the filter situated adjacent, and to the housing.

The practicability of the example production method described here is not limited to a temporal sequence of method steps S1 through S7 corresponding to their numbering.

What is claimed is:

1. An electronics apparatus, comprising:
   a housing made at least partly of a conductive material;
   an inverting device situated in the housing;
   a first circuit board situated in the housing, the first circuit board being electrically connected to the inverting device via at least one line;
   a second circuit board situated in the housing, the second circuit board being electrically connected to the first circuit board via a first galvanic connection, and the second circuit board being electrically connected via a second galvanic connection to at least one component of the electronics apparatus situated at least one of in the housing and on the housing;
   a first filter having a first discharge connection to the housing, the first filter being situated on the first circuit board and upstream from the first galvanic connection;
   a second filter having a second discharge connection to the housing, the second filter being situated on the second circuit board and downstream from the first galvanic connection; and
   a third filter having a third discharge connection to the housing, the third filter being situated on the second circuit board and upstream from the second galvanic connection.

2. The electronics apparatus as recited in claim 1, wherein the second circuit board is electrically connected via the second galvanic connection to a third circuit board as the at least one component situated in the housing, the third circuit board being electrically connected via a third galvanic connection to at least one further component of the electronics apparatus situated at least one of in the housing and on the housing, and the electronics apparatus having a fourth filter having a fourth discharge connection to the housing, the fourth filter being situated on the third circuit board and downstream from the second galvanic connection, and a fifth filter having a fifth discharge connection to the housing, the fifth filter being situated on the third circuit board and upstream from the third galvanic connection.

3. The electronics apparatus as recited in claim 2, wherein at least one of the first filter, the second filter, the third filter, the fourth filter, and the fifth filter are fashioned as a T filter.

4. The electronics apparatus as recited in claim 1, wherein at least one of the first galvanic connections has a first ribbon cable, the second galvanic connection has a second ribbon cable, and the third galvanic connection has a third ribbon cable.

5. The electronics apparatus as recited in claim 4, wherein the at least one of the first ribbon cable, the second ribbon cable, and the third ribbon cable has at least one of a length in a range of from 5 cm through 50 cm, and a width in a range of from 3 cm through 12 cm.

6. The electronics apparatus as recited in claim 2, wherein at least one of: i) the first filter, the first galvanic connection, and the second filter act together as a first pi filter, and ii) the third filter, the second galvanic connection, and the fourth filter act together as a second pi filter.

7. The electronics apparatus as recited in claim 2, wherein the electronics apparatus has at least one plate-type shielding unit that is made at least partly of a conductive material and is electrically connected to an associated discharge connection of at least one of the first, second, third, fourth, and fifth filter, and also to the housing.

8. The electronics apparatus as recited in claim 2, wherein at least one of an inverter controlling is fashioned on the first circuit board, a control electronics being fashioned on the second circuit board, and a plug electronics being fashioned on the third circuit board.

9. The electronics apparatus as recited in claim 1, wherein the electronics apparatus is at least one of a power electronics system, a pulse inverter, a hybrid engine, and a DC/DC converter.

10. A method for producing an electronics apparatus, comprising:
    situating an inverting device of a first circuit board and of a second circuit board in a housing made at least partly of a conductive material;
    electrically connecting the inverting device to the first circuit board via at least one line;
    electrically connecting the first circuit board to the second circuit board via a first galvanic connection;
    electrically connecting the second circuit board via a second galvanic connection to at least one component of an electronics apparatus situated at (least one of in the housing and on the housing;
    forming a first filter situated on the first circuit board having a first discharge connection to the housing, the first filter being situated upstream from the first galvanic connection;
    forming a second filter situated on the second circuit board having a second discharge connection to the housing, the second filter being situated downstream from the first galvanic connection; and
    forming a third filter situated on the second circuit board having a third discharge connection to the housing, the third filter being situated upstream from the second galvanic connection.

* * * * *